United States Patent
Fukui et al.

(10) Patent No.: US 7,759,845 B2
(45) Date of Patent: Jul. 20, 2010

(54) PIEZOELECTRIC SUBSTANCE ELEMENT, LIQUID DISCHARGE HEAD UTILIZING THE SAME AND OPTICAL ELEMENT

(75) Inventors: Tetsuro Fukui, Yokohama (JP); Kenichi Takeda, Yokohama (JP); Katsumi Aoki, Yokohama (JP); Toshihiro Ifuku, Yokohama (JP); Takanori Matsuda, Tokyo (JP); Hiroshi Funakubo, Yokohama (JP); Shintaro Yokoyama, Yokohama (JP); Takashi Katoda, Kochi (JP); Ken Nishida, Yokosuka (JP)

(73) Assignees: Canon Kabushiki Kaisha, Tokyo (JP); Tokyo Institute of Technology, Tokyo (JP)

(*) Notice: Subject to any disclaimer, the term of this patent is extended or adjusted under 35 U.S.C. 154(b) by 638 days.

(21) Appl. No.: 11/683,100

(22) Filed: Mar. 7, 2007

(65) Prior Publication Data

US 2007/0215715 A1 Sep. 20, 2007

(30) Foreign Application Priority Data

Mar. 10, 2006 (JP) .............................. 2006-066361

(51) Int. Cl.
*H01L 41/08* (2006.01)
(52) U.S. Cl. ..................................................... 310/358
(58) Field of Classification Search ......... 310/357–359, 310/311, 328; 252/62.9 R, 62.9 PZ; 239/102.2; H01L 41/08, 41/09
See application file for complete search history.

(56) References Cited

U.S. PATENT DOCUMENTS

| 6,854,832 | B2 | 2/2005 | Matsuda |
| 7,042,141 | B2 | 5/2006 | Funakubo et al. |
| 7,053,526 | B2* | 5/2006 | Unno et al. .................. 310/324 |
| 7,120,978 | B2* | 10/2006 | Wasa et al. .................. 310/358 |
| 7,144,101 | B2 | 12/2006 | Ifuku et al. |
| 7,235,917 | B2 | 6/2007 | Fukui et al. |
| 7,262,544 | B2 | 8/2007 | Aoki et al. |
| 2007/0046152 | A1 | 3/2007 | Ifuku et al. |
| 2007/0046153 | A1 | 3/2007 | Matsuda et al. |
| 2007/0046734 | A1 | 3/2007 | Aoki et al. |
| 2007/0048190 | A1 | 3/2007 | Ifuku et al. |

(Continued)

FOREIGN PATENT DOCUMENTS

JP 6-350154 12/1994

(Continued)

*Primary Examiner*—Walter Benson
*Assistant Examiner*—Karen B Addison
(74) *Attorney, Agent, or Firm*—Fitzpatrick, Cella, Harper & Scinto

(57) ABSTRACT

An optical element satisfactory in transparency and characteristics as an optical modulation element, and a piezoelectric substance element satisfactory in precision and reproducibility as a fine element such as MEMS can be provided. The piezoelectric substance element includes, on a substrate, at least a first electrode, a piezoelectric substance film and a second electrode. The piezoelectric substance film does not contain a layer-structured boundary plane; the crystal phase constituting the piezoelectric substance film comprises at least two of a tetragonal, a rhombohedral, a pseudocubic, an orthorhombic and a monoclinic; and the piezoelectric substance film includes, in a portion in which a change in the composition is within a range of ±2%, a portion where a proportion of the different crystal phases changes gradually in a thickness direction of the film.

6 Claims, 6 Drawing Sheets

U.S. PATENT DOCUMENTS

2007/0060467 A1 3/2007 Matsuda et al.
2007/0090728 A1 4/2007 Matsuda et al.
2008/0012054 A1 1/2008 Ifuku et al.
2008/0012909 A1 1/2008 Matsuda et al.
2008/0012910 A1 1/2008 Matsuda et al.

FOREIGN PATENT DOCUMENTS

JP 8-186182 7/1996

* cited by examiner

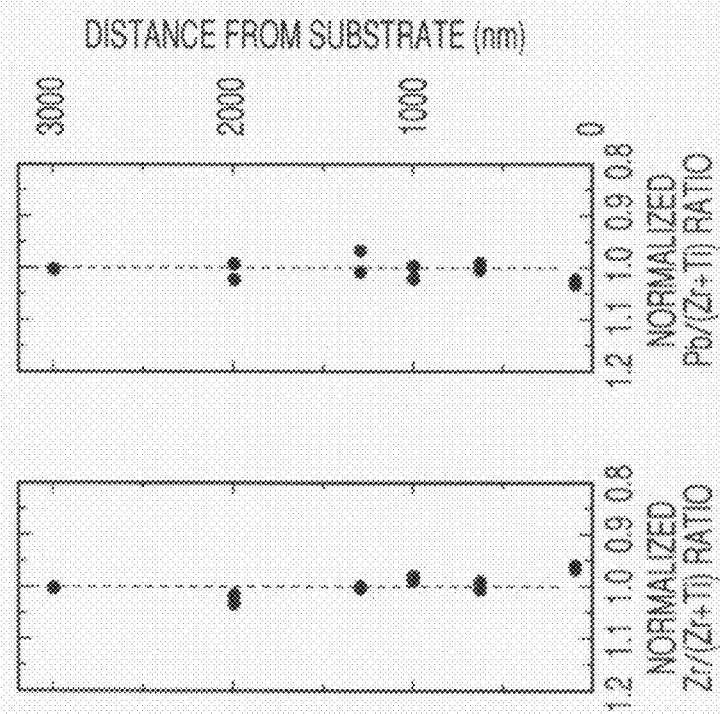
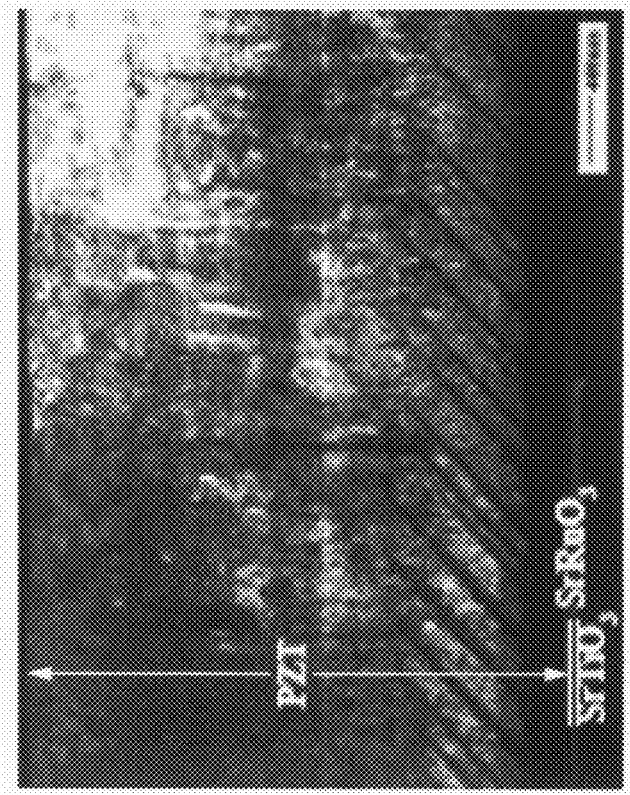

PIEZOELECTRIC SUBSTANCE ELEMENT, LIQUID DISCHARGE HEAD UTILIZING THE SAME AND OPTICAL ELEMENT

BACKGROUND OF THE INVENTION

1. Field of the Invention

The present invention relates to a piezoelectric substance element, a liquid discharge head utilizing the same and an optical element.

2. Description of the Related Art

Research is being made in forming ferroelectric or dielectric materials into a thin film and utilizing it in a piezoelectric substance element such as MEMS or an optical element. Particularly research is being actively made in forming a film of perovskite type oxides of $ABO_3$ type and utilizing it as a device such as a piezoelectric substance element or an optical element, and attempts are being made in controlling the crystal orientation of the perovskite type oxide thereby, improving the characteristics of the device.

For example Japanese Patent Application Laid-Open No. H06-350154 discloses a thin film of lead zirconate titanate (PZT) having a rhombohedral <111> orientation of 70% or higher within a compositional range normally assuming a tetragonal structure, and a thin film of the same material having a tetragonal <001> orientation of 70% or higher within a compositional range normally assuming a rhombohedral structure.

Also Japanese Patent Application Laid-open No. 8-186182 discloses a PZT film showing a compositional change in the thickness direction of the film.

However, in the films of the former, the crystal phase in a bulk state of composition and the crystal phase in a thin film are inverted, presumably because a state having a film stress in a thin film is retained. Also because of this inversion in the crystal phases, desired satisfactory characteristics may not be obtained in case of forming a thin film. Also the latter film is a film of tetragonal only with a gradient in the composition, and desired piezoelectric characteristics may not be obtained.

Also a method of obtaining a film of satisfactory characteristics with a PZT film in MPB region is disclosed in U.S. Pat. No. 7,042,141(B2). It describes a PZT (111) film in which a tetragonal and a rhombohedral are present in mixture. Also FIG. 2 of this patent reference exhibits a view indicating mixed crystal phases. Also FIG. 8 indicates, in a mixed-phase region of the PZT (111) film, that Zr/(Zr+Ti) ratio is from 0.40 to 0.65. However, there is no description on the film of satisfactory characteristics in the PZT {100} film. Therefore, this patent reference is considered not to include description on a mode of {100} film in which crystal phases of satisfactory characteristics are present in mixture.

SUMMARY OF THE INVENTION

An object of the present invention is to provide a film of a ferroelectric substance or a piezoelectric substance, having satisfactory characteristics and showing little deterioration in the characteristics even when the film thickness fluctuates. Another object of the present invention is to provide a piezoelectric substance element, having satisfactory precision and reproducibility as a fine element such as MEMS, and a liquid discharge head prepared with the piezoelectric substance element of such satisfactory characteristics. Still another object of the present invention is to provide an optical element satisfactory in transparency and characteristics as an optical modulation element.

The piezoelectric substance element of the present invention includes, on a substrate, at least a first electrode, a piezoelectric substance film and a second electrode, wherein the piezoelectric substance film does not contain a layer-structured boundary plane, the crystal phase constituting the piezoelectric substance film includes at least two of a tetragonal, a rhombohedral, a pseudocubic, an orthorhombic and a monoclinic, and the piezoelectric substance film includes, in a portion in which a change in the composition is within a range of ±2%, a portion where a proportion of the different crystal phases changes gradually in a thickness direction of the film.

The liquid discharge head of the present invention includes a discharge port for discharging a liquid, a liquid flow path communicating with the discharge port, and a discharge energy generating element for generating energy to be used for liquid discharge from the discharge port, wherein the discharge energy generating element utilizes the piezoelectric substance element of the aforementioned structure.

The aforementioned objects of the present invention can be also accomplished by an optical element including, on a substrate, a first electrode, a ferroelectric substance film and a second electrode, wherein the ferroelectric substance film does not contain a layer-structured boundary plane, the crystal phase constituting the ferroelectric substance film includes at least two of a tetragonal, a rhombohedral, a pseudocubic, an orthorhombic and a monoclinic, and the ferroelectric substance film includes, in a portion in which a change in the composition is within a range of ±2%, a portion where a proportion of the different crystal phases changes gradually in a thickness direction of the film.

The present invention can provide a ferroelectric substance film or a piezoelectric substance film having satisfactory characteristics and showing little deterioration in the characteristics by a variation in the film thickness. Also the present invention can provide a piezoelectric substance element satisfactory in precision and in reproducibility as a fine element such as MEMS. Also the present invention can provide a liquid discharge head, prepared with the piezoelectric substance element having such satisfactory characteristics. Furthermore, the present invention can provide an optical element satisfactory in transparency and in characteristics as an optical modulation element.

Further features of the present invention will become apparent from the following description of exemplary embodiments, with reference to the accompanying drawings.

BRIEF DESCRIPTION OF THE DRAWINGS

FIGS. 5A and 5B are views indicating a compositional ratio of a piezoelectric substance film applicable in the present invention, in the thickness direction, and FIG. 5C is a SEM image.

DESCRIPTION OF THE EMBODIMENTS

A piezoelectric substance element of the present invention includes, on a substrate, at least a first electrode, a piezoelectric substance film, and a second electrode. Also an optical element of the present invention includes, on a substrate, at least a first electrode, a ferroelectric substance film, and a second electrode.

Each of such ferroelectric substance film and piezoelectric substance film is characterized in that the constituting crystal phase includes at least two of a tetragonal, a rhombohedral, a pseudocubic, an orthorhombic and a monoclinic, and the film composition includes, in a portion in which a change in the composition is within a range of ±2%, a portion where a proportion of the different crystal phases changes gradually in a thickness direction of the film. In the case that the optical element includes a clad layer, and a core layer, the ferroelectric substance film constitutes the core layer.

Figure 7:
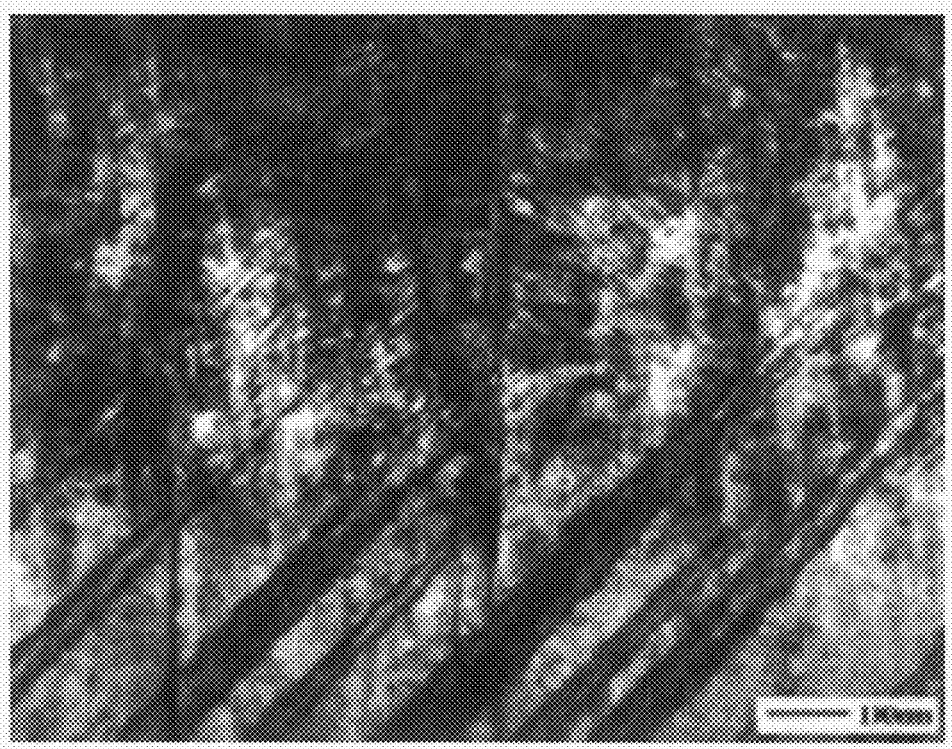
FIG. 7 is a magnified TEM image of a boundary portion of the TEM image in FIG. 5C.

Such piezoelectric substance film or the ferroelectric substance film does not include a layer-structured boundary plane in the entire film. In spite of the change in the crystal phase, the film lacks a layer-structured boundary plane, and this fact can be confirmed in an observation under SEM (scanning electron microscope) or TEM (transmission electron microscope). As an example of TEM observation, FIG. 7 illustrates a magnified TEM image of a boundary-like portion of the TEM image in FIG. 5C. In FIG. 5C, it may appear that the boundary plane exists, but a closer look will clarify that it is caused by the difference in the state of domain structures and the boundary plane is absent, as will be understood from FIG. 7.

"Gradual change" means, in at least a certain portion in the thickness direction of the film, a proportion of a specified crystal phase changes progressively. "Progressive change" means that, in an arbitrary thickness direction in a region where the crystal phase changes, a proportion of a specified crystal phase progressively increases or progressively decreases. In the region where the proportion of crystal phase changes, no substantial change exists in the composition. More specifically, even when a change exists in the composition, such compositional change is within a variation range of ±2%. Such compositional change can be determined as a change in the proportion of one or more set components, selected from two or more set components. For example, in Example 1 to be described later, relating to an oxide film containing two or more metal elements as set components, changes are determined on the proportion of Pb with respect to the sum of Zr and Ti, and on the proportion of Zr with respect to Ti. Thus, it means that the compositional change in the ratio of the A-site element with respect to the B-site elements or in an element within the B-site elements is within a range of ±2%.

Also it is preferable that the ferroelectric substance film or the piezoelectric substance film includes at least a tetragonal and that a volume ratio of the tetragonal is lower in relative manner at a surface side in the thickness direction of the film and is relatively higher at the other surface side. It is also preferable that the ferroelectric substance film or the piezoelectric substance film has a crystal orientation {100}. Also the ferroelectric substance film or the piezoelectric substance film can be formed by lead zirconate titanate and/or a relaxor material. Also the ferroelectric substance film or the piezoelectric substance film preferably has a thickness of from 1.0 to 15 μm. Furthermore, the ferroelectric substance film, when employed as a core layer of the optical element, preferably has a thickness of from 1.0 to 15 μm, more preferably from 2.0 to 10 μm.

In the following, an exemplary embodiment of the present invention, employing an $ABO_3$ type perovskite oxide film (hereinafter simply called an oxide film) in the ferroelectric substance film or the piezoelectric substance film, will be described.

The $ABO_3$ type perovskite oxide film in the present invention is a film of a structure in which at least two different crystal phases (crystal structures) are mixed and in which the mixed ratio of the different crystal structures changes gradually in the thickness direction of film while maintaining a substantially constant composition. Also the oxide film is preferably a film having a {100} orientation or formed by a {100} single crystal. The "crystal orientation {100}" means (100), (010), (001) and the like also in the case of tetragonal.

In particular, the film has a {100} orientation and includes at least two crystal phases among a tetragonal, a rhombohedral, a pseudocubic, an orthorhombic and a monoclinic. Among these, preferred is a film including at least a tetragonal and a pseudocubic, or a film including at least a tetragonal and a rhombohedral.

The oxide film of the present invention includes a portion where the crystal phases gradually change in the thickness direction of film, while the composition shows no substantial change, or, a change only within a range of ±2% even in case of the presence of a compositional change.

In the piezoelectric substance element or the optical element of the present invention, the oxide film includes a changing portion of the mixing proportion of the crystal phases at least within the film, without a change in the composition. Thus, it may also include a portion showing a compositional change exceeding ±2%, in a portion other than the changing portion of the mixing proportion of the crystal phases.

In the above-described structure, the gradual change in the mixing proportion of the crystal phases relaxes the film stress, in comparison with a case where the entire film has a fixed proportion of crystal phases, so that the satisfactory characteristics can be maintained even when the film thickness is changed according to the purpose, whereby the aforementioned effects can be accomplished.

The oxide film preferably has a higher proportion of tetragonal on a surface and a lower proportion of tetragonal on the other surface. It is more preferable that the proportion of tetragonal is higher on a surface at the side of the substrate, and the proportion of tetragonal is lower on the other surface. Such crystal structure is particularly advantageous in forming the oxide film on a substrate. More specifically, after formation of a film having a higher proportion of tetragonal {100}, a film thickening process is executed by a film formation which provides a higher content in a rhombohedral (100), a pseudocubic {100}, an orthorhombic {100} or a monoclinic {100}, than the content in tetragonal {100}. Such film forming method has a wide latitude and is therefore advantageous. Thus advantageous is a film having at least two or more crystal phases (crystal structures) even on both surfaces of the film.

Examples of the advantageous material for constituting the ferroelectric substance film or the piezoelectric substance film include lead zirconate titanate (PZT) type materials represented by $Pb(Zr, Ti)O_3$ and relaxor materials. According to the desired characteristics, the oxide film may be formed by employing the (PZT) type material and the relaxor material in combination.

The PZT type material may contain, in addition to Pb, Zr and Ti, a dopant element such as an A-site substituting element or a B-site substituting element. Also in a morphotropic phase boundary (MPB) region in a {100} thin film without dopant, a ratio Zr/(Zr+Ti) is preferably from 0.43 to 0.60.

When La is contained as a dopant, the ratio Zr/(Zr+Ti) is preferably from 0.55 to 0.75. Also the ratio of Pb amount to the amount of B-site elements is preferably from 1.00 to 1.25.

The relaxor material is advantageously selected from following materials: $Pb(Mg, Nb)O_3$—$PbTiO_3$ (PMN—PT), $Pb(Zn, Nb)O_3$—$PbTiO_3$ (PZN—PT), $Pb(Ni, Nb)O_3$—$PbTiO_3$ (PNN—PT), $Pb(Yb, Nb)O_3$—$PbTiO_3$ (PYN—PT), $Pb(Sc, Ta)O_3$—$PbTiO_3$ (PST-PT), and $Pb(Sc, Nb)O_3$—$PbTiO_3$ (PSN—PT).

The present inventors, based on the finding that such mixed-phase regions have satisfactory characteristics, have found that a structure having a gradual change in the mixing proportion of the crystal phases in the thickness direction of film is more preferable in constructing a device, as described in the present invention.

In the oxide film of the present invention, as described above, the proportion of each of different crystal phases changes in the thickness direction of the film, but the compositional proportion is substantially constant. The composition being substantially constant in the thickness direction of film means that the ratio of metal elements converges within a range of ±2.0%, preferably ±1.0%. The composition can be measured by the TEM-EDS method.

The ferroelectric substance film and the piezoelectric substance film, including the oxide film of the present invention, preferably has a film thickness of from 1.0 to 15 µm. The film thickness within such range enables to provide a satisfactory discharge power, when employed as a piezoelectric substance film of a piezoelectric substance element in the liquid discharge head constituting an exemplary embodiment of the present invention, and is more suitable for miniaturization in the application to MEMS. Therefore, the piezoelectric substance film of the present invention, in case of having a film thickness of from 1.0 to 15 µm, can provide a piezoelectric substance element which is more advantageous for the liquid discharge head. The film thickness is more preferably from 1.5 to 10 µm.

In order to utilize the oxide film of the present invention, as a ferroelectric substance film of an optical element or a piezoelectric substance film of a piezoelectric substance element, an oxide film is formed on an electrode disposed on a substrate. The film formation is conducted under heating of the substrate, and an oxide film of the aforementioned structure can be obtained by inserting, in the course of film formation, a step of relaxing the film stress. As the film forming method, a thin film forming method such as sputtering or MO-CVD can be employed advantageously.

For relaxing the film stress, a film formation method with a reduced deposition rate can be utilized. More specifically, in case of sputtering, the deposition rate can be reduced by increasing the substrate-target distance in the course of film formation. Also in case of MO-CVD, the deposition rate can be reduced, in addition to the method above, by decreasing the supply amount of the raw material gas.

The step of reducing the deposition rate is preferably executed while the oxide film is formed within a thickness range of from 0.3 to 4.0 µm, and preferably from 0.4 to 2.2 µm. The control within such film thickness range enables to maintain more advantageous characteristics when the oxide film has the aforementioned film thickness.

Therefore, in the thin film of the present invention, a starting position of the gradual change in the mixing proportion of the crystal phases can be present within a film thickness range of from 0.3 to 4.0 µm, preferably from 0.4 to 2.2 µm. The region of such change in the mixing proportion is preferably at least 10 to 90% of the total film thickness, and more preferably from 20 to 80%.

Figure 1:
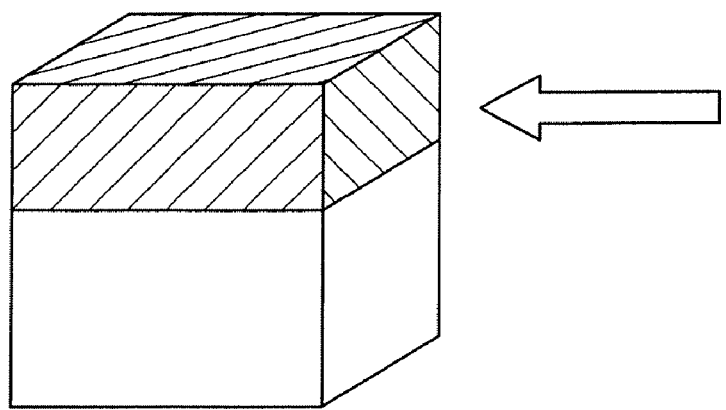
FIG. 1 is a schematic view for illustrating direction of incident light in a Raman spectroscopy.

For measuring whether the oxide film contains a changing structure in the crystal phases, an X-ray diffractometry or a Raman spectroscopy can be used. The Raman spectroscopy is advantageous as it can focus the measuring spot to a diameter of 1.0 µm or smaller, and the measurement can be executed within a short time. The measurement can be executed by employing a sample having a cross section along the thickness direction of the film, and, as illustrated in FIG. 1, by introducing a laser beam (indicated by an arrow in the drawing) from the cross section in the thickness direction and measuring a Raman scattered light. The laser beam is advantageously polarized. Also whether the oxide film has a crystal orientation {100} can be verified by an X-ray diffractometry.

The substrate is preferably a single crystal substrate in the case that the oxide film is a single crystal. The single crystal substrate may be an Si substrate, an SOI substrate, an $SrTiO_3$ substrate or a MgO substrate, among which preferred are an Si substrate and an SOI substrate. In the case that the oxide film is a film of single orientation, a SUS substrate, a metal substrate or a ceramic substrate may be used in addition to the Si substrate or SOI substrate, but an Si substrate and an SOI substrate is preferred.

In order to obtain an epitaxial oxide film, the film formation is executed on the Si substrate or SOI substrate, through an epitaxial (100) film such as of YSZ, $SrTiO_3$ or MgO. In order to obtain an oxide film of a single orientation, the film formation is executed through a metal oxide (100) conductive layer on a face-centered cubic crystalline metal.

The element of the present invention includes a first electrode and a second electrode. These electrodes may be upper and lower electrodes sandwiching the oxide film, or may be comb-tooth shaped electrodes disposed on the oxide film.

In the case of upper and lower electrodes, the lower electrode is provided on the substrate. Between the lower electrode and the substrate, a buffer layer can be disposed for the purpose of controlling orientation. The buffer layer can be formed by for example a YSZ film, an $SrTiO_3$ film or a MgO film.

Examples of the material to be employed in the electrode include a face-centered cubic crystalline metal, a hexagonal close packed crystalline metal, a body-centered cubic crystalline metal and an $ABO_3$ type perovskite oxide. Among these, the face-centered cubic crystalline metal can advantageously be Pt, Ir, Au, Ni or Cu. The hexagonal close packed crystalline metal can advantageously be Ru, Ti or Os. Also the body-centered cubic crystalline metal can advantageously be Cr, Fe, W or Ta. A part of such metal material may form an oxide to an extent not deteriorating the crystallinity and the conductive property. In particular, an outermost surface formed by an oxide is advantageous in suppressing the diffusion of lead in the piezoelectric substance film. The $ABO_3$ type perovskite oxide can advantageously be $SrRuO_3$, (La, Sr)$CoO_3$, $BaPbO_3$, (La, Sr)$TiO_3$, or $LaNiO_3$. Such electrode material may include plural materials, and, in such case, may have a layered structure of two or more layers.

The electrode has a film thickness of from 50 to 500 nm, preferably from 100 to 400 nm. A thickness less than 50 nm may result in an insufficient conductivity, thus being undesirable. A thickness exceeding 500 nm may result in a reduced variation in the element characteristics and an inferior control on the crystallinity, thus being undesirable.

Figure 3:
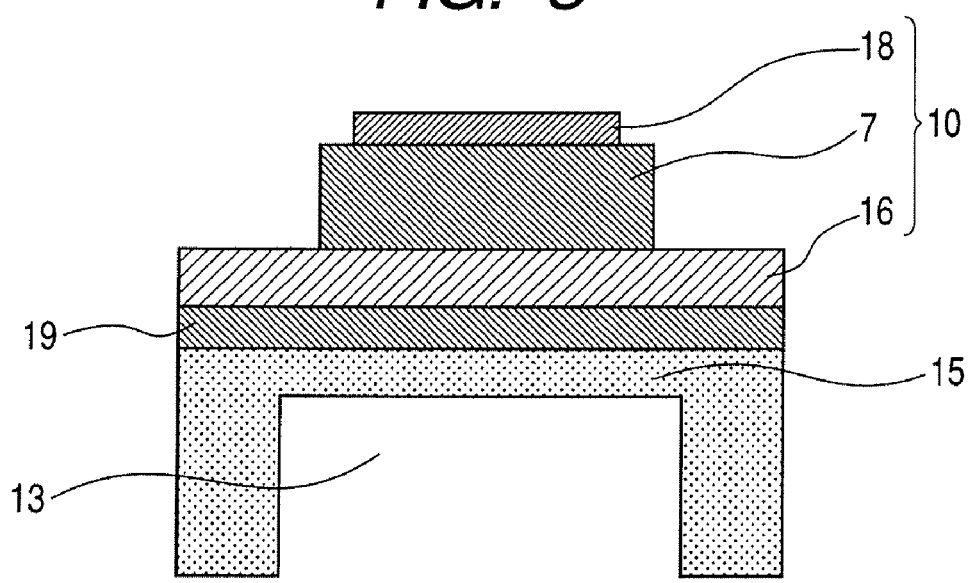
FIG. 3 is a cross-sectional view of a piezoelectric substance element.

FIG. 3 illustrates an example of the structure of a piezoelectric substance element, utilizing the oxide film of the above-described structure as the piezoelectric substance film. The piezoelectric substance element includes a substrate 15, a first electrode 16, a piezoelectric substance film 7 and a second electrode 18. The piezoelectric substance film 7 is patterned, when necessary, as illustrated in FIG. 3.

Figure 4A:
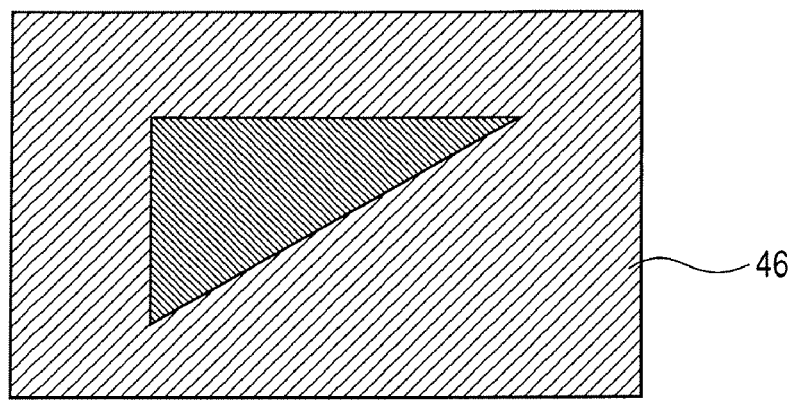
FIG. 4A is a plan view of an optical element.
Figure 4B:
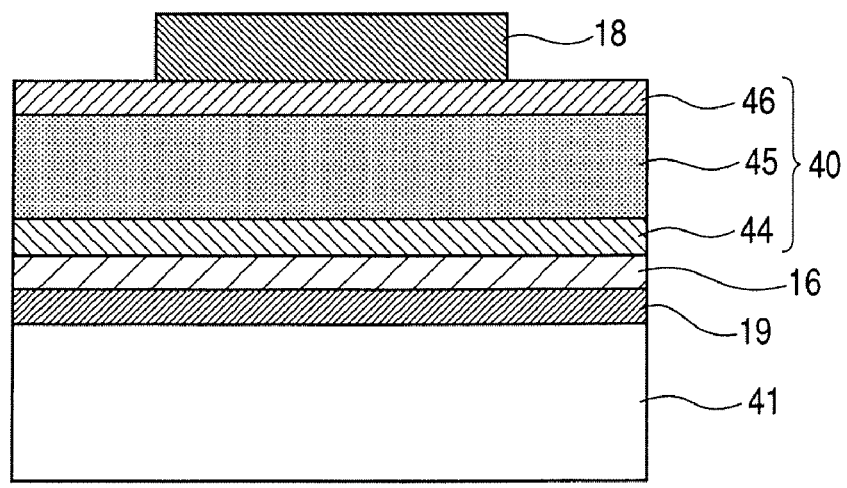
FIG. 4B is a vertical cross-sectional view of the optical element.

FIGS. 4A and 4B illustrate an example of the optical element, utilizing the oxide film of the above-described structure as the ferroelectric substance film. FIGS. 4A and 4B illustrate a scrub type optical waveguide, constituting an example of the optical element. FIG. 4A is a schematic view seen from the side of an upper electrode 18, and FIG. 4B is a view seen from the side of cross section. There are illustrated an optical waveguide layer 40, including clad layers 44, 46 and a core layer 45; a substrate 41, advantageously an Si substrate; a buffer layer 19 for forming an orienting film or an epitaxial film on the Si substrate; an electrode layer 16; and an upper electrode 18 constituting a polarizing electrode. The ferroelectric substance film of the present invention is employed in the core layer 45.

Figure 2:
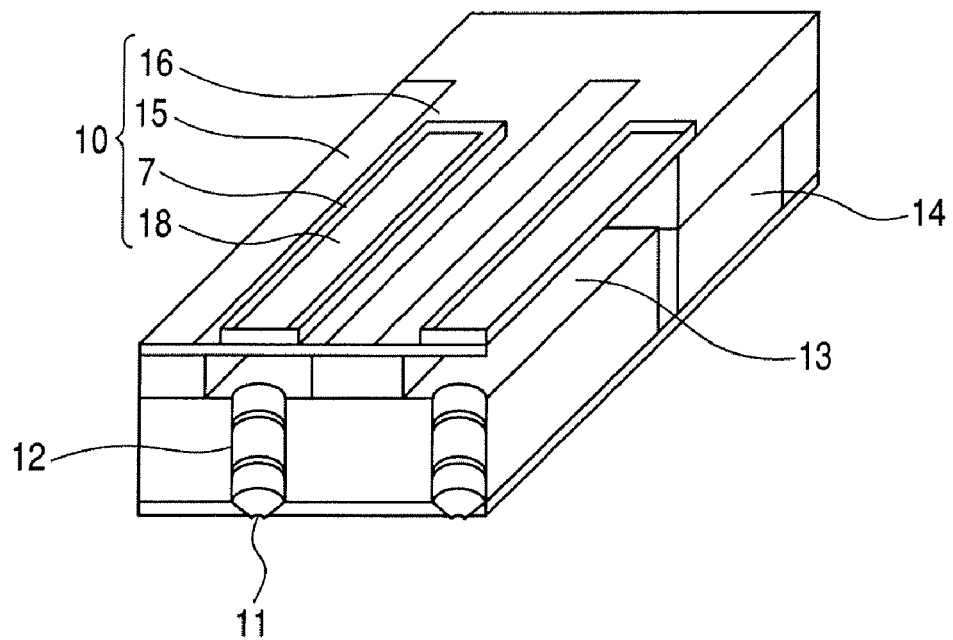
FIG. 2 is a schematic view of a liquid discharge head.

A liquid discharge head of the present invention will be described with reference to FIGS. 2 and 3. The liquid discharge head of the present invention is a liquid discharge head including the piezoelectric substance element described above. FIG. 2 is a schematic view of the liquid discharge head, in which illustrated are a discharge port 11; a communicating opening 12 connecting a separate liquid chamber 13 and the discharge port 11; a common liquid chamber 14, a vibrating plate 15, and a piezoelectric substance element 10. The piezoelectric substance element 10 has a rectangular shape as illustrated, but may also have another shape, such as an oval shape, a circular shape or a parallelogram shape. In such case, the piezoelectric substance film 7 assumes a shape matching the shape of the separate liquid chamber.

Now the structure in the vicinity of the piezoelectric substance element 10, constituting the liquid discharge head of the present invention, will be described with reference to FIG. 3. FIG. 3 is a cross-sectional view of the piezoelectric substance element in the width direction of the liquid discharge head illustrated in FIG. 2. The piezoelectric substance element 10 is illustrated with a rectangular cross-sectional shape, but may have a trapezoidal or inverted trapezoidal shape. In the drawing, the first electrode film 6 corresponds to the lower electrode film 16 and the second electrode film 8 corresponds to the upper electrode film 18, but each of the first electrode film 6 and the second electrode film 8, constituting the piezoelectric substance element 10 of the present invention, may constitute either of the lower electrode film 16 and the upper electrode film 18. Similarly, a vibrating plate 15 may be the substrate constituting the piezoelectric substance element 10 of the present invention. These differences arise from the device producing process, and the effects of the present invention can be attained in any of the structures. Also a buffer layer 19 may be disposed between the vibrating plate 15 and the lower electrode film 16.

In the above-described liquid discharge head, elongation-contraction of the piezoelectric substance film induces an up-down movement of the vibrating plate, to apply a pressure to the liquid in the separate liquid chamber, thereby discharging the liquid from the discharge port. The head of the present invention is applicable, not only to a printer, but also to a manufacturing apparatus for an electronic device. The vibrating plate has a thickness of from 1.0 to 15 µm, preferably from 1.5 to 8 µm. The substrate of the piezoelectric substance element may be utilized as the vibrating plate. The material constituting the vibrating plate is, as described above, preferably Si. Also a buffer layer and electrode layers on Si may also constitute a part of the vibrating plate. Si in the vibrating plate may be doped with B. The buffer layer has a thickness of from 5 to 300 nm, preferably from 10 to 200 nm.

The discharge port has a size of from 5 to 40 µmφ. The discharge port has a circular shape, but may also have a star shape, a polygonal shape or a triangular shape.

EXAMPLES

Now the present invention will be further clarified by examples.

Example 1

On an $SrTiO_3$ (100) substrate of a thickness of 5 mm, an $SrRuO_3$ (100) epitaxial layer, constituting a metal oxide electrode layer, was formed by rf-sputtering. Then a $Pb(Zr, Ti)O_3$ epitaxial film was formed with a thickness of 3.0 µm, by a pulsed MO-CVD method, which is an MO-CVD method with an intermittent raw material gas supply, under raw material supply so as to obtain Zr/Ti ratio of 50/50. The film contained a mixture of tetragonal and rhombohedral, in which the tetragonal had a (100)/(001) orientation while the rhombohedral had a (100) orientation. The film forming conditions were changed, from a thickness of 0.8 µm, so as to increase the content ratio of the rhombohedral phase. The film forming conditions were changed by increasing each raw material gas supply time from 8 seconds to 15 seconds, by increasing the oxygen partial pressure, and increasing the revolution of the substrate from 6 rpm to 11 rpm. The epitaxial film was obtained under heating of the substrate at 600° C.

Figure 6:
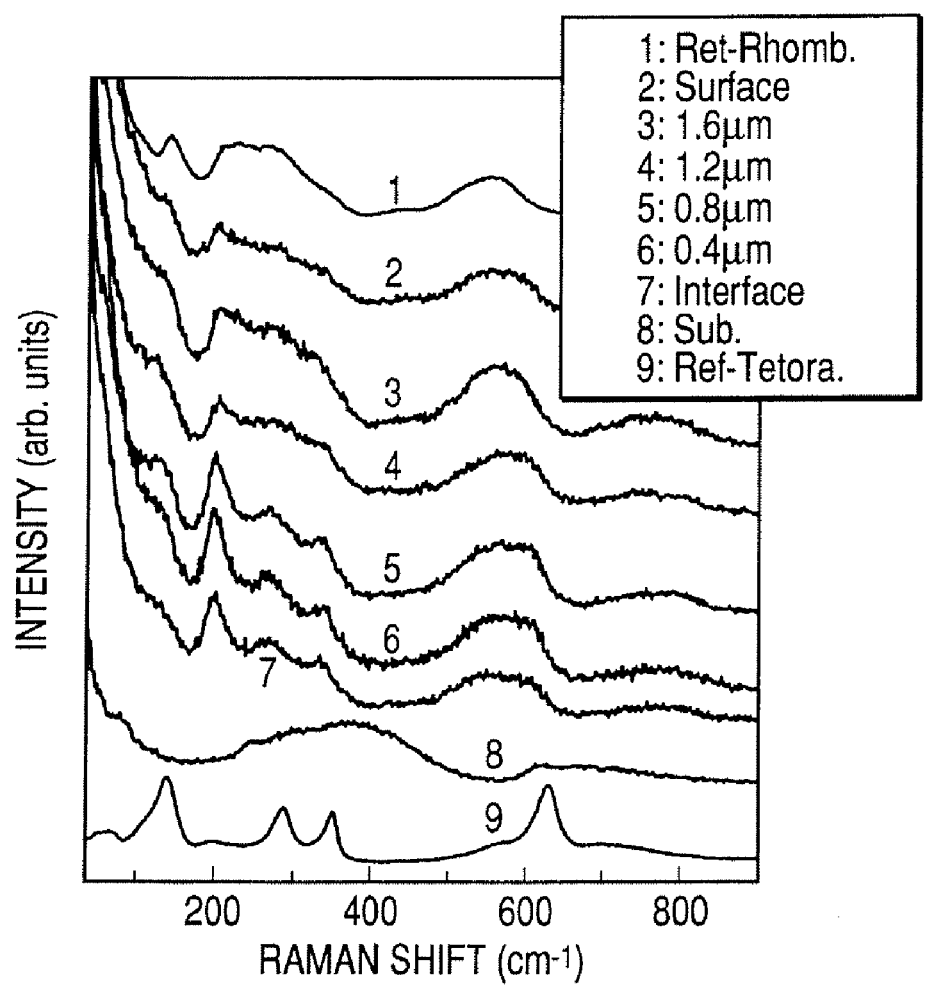
FIG. 6 is a view illustrating the result of a Raman spectroscopic measurement on a piezoelectric substance film applicable in the present invention.

FIG. 6 illustrates the result of a Raman measurement conducted on the cross section of this film. FIG. 6 illustrates measured peak shifts in the Raman spectroscopy of from 50 to 900 $cm^{-1}$. The abscissa indicates a wave number from 50 to 900, and the ordinate indicates the relative peak intensity in an arbitrary unit. For the purpose of facilitating the comparison, the peak shifts at different film thicknesses are illustrated together with those of tetragonal only and of rhombohedral only. In FIG. 6, the lowermost curve indicates the peak shift of a film of tetragonal only (Ref-Tetra), and the uppermost curve indicates the peak shift of a film of rhombohedral only (Ref-Rhomb.). The illustrated peak shifts respectively correspond, from the bottom but excluding the lowermost one, to the substrate (Sub.), an interface between the PZT film and the substrate (Interface), a portion of 0.4 µm in the piezoelectric substance film from the substrate interface, a portion of 0.8 µm, a portion of 1.2 µm, a portion of 1.6 µm and an outermost surface (Surface). As will be understood from these results, observed shifts indicate overlapping of the peaks of tetragonal and rhombohedral over the entire film, but a change in the proportion thereof can be identified from the changes in the peak intensities. More specifically, the peak intensities around 270 $cm^{-1}$ and 350 $cm^{-1}$, which are specific to the tetragonal, are found to become smaller along with an increase in the film thickness. Also the marked changes in the peak shift at thicknesses of 0.8 and 1.2 µm indicate that the proportion of the crystal phases has changed in such film thickness range, as anticipated from the producing method.

FIGS. 5A and 5B are graphs illustrating the composition of this film, measured by TEM-EDS. FIG. 5B indicates a compositional ratio of Pb with respect to the sum of Zr and Ti, and FIG. 5A indicates a Zr/Ti ratio. The abscissa represents the film thickness, and the ordinate represents the compositional ratio. The compositional change in the film thickness illustrated in FIGS. 5A and 5B has satisfactory uniformity over the entire film, and it can be seen that the composition is constant with a change of 2.0% or less, in a region (from 0.6 to 1.2 µm) where the mixing proportion of the crystal phases starts to change.

In a SEM observation of this film, a layer-structured boundary plane was not observed in the film (FIG. 5C). Also the e31 property of this film was evaluated as −10.6 and identified as satisfactory. The e31 property was obtained by preparing a unimorph element of 6.5 mm×1.5 mm and by calculation from a displacement amount thereof and an electric field intensity.

Comparative Example 1

A PZT film was prepared in the same manner as in Example 1, except that the film formation was executed without the change in the conditions in the course thereof. It had a composition Zr/Ti=50/50, and had mixed phases of tetragonal and rhombohedral. However, the mixing proportion of the crystal phases was uniform over the entire film, and, as a result of Raman spectroscopy, the change in the peak intensity was almost absent in comparison with the film of Example 1. This film had an e31 property of −8.2, indicating a smaller displaceability in comparison with that of Example 1.

Example 2

A substrate prepared by laminating, on a 4-inch SOI (100) substrate, YSZ (100), $CeO_2$ (100), $LaNiO_3$ (100) and $SrRuO_3$ (100) in succession as buffer layers, was employed. The SOI substrate employed had an SOI (100) layer of 3.0 μm, and an $SiO_2$ layer in box layer of 1.0 μm. A PZT film was formed by sputtering on the $SrRuO_3$ electrode layer. The film formation was conducted with two targets which were a $PbZrO_3$ target and a $PbTiO_3$ target, in such a manner as to obtain a Zr/Ti ratio of 52/48. The film formation was conducted under heating of the substrate at 600° C., and, in order to change the mixing proportion of the crystal phases, the substrate-target distance was increased and the revolution of the substrate was increased when the thickness reached 0.4 μm. Finally obtained was a PZT film of a thickness of 2.5 μm. The composition of the film, measured in the same manner as in Example 1, was approximately constant, showing a change only within a variation range of ±1.5%. Also in Raman spectroscopy for measuring the film thickness dependence of crystal phases, it was identified that the peak intensity, attributable to the tetragonal phase, decreased from 0.4 μm, indicating a gradient change in the proportion of the crystal phases. The change was observed within a thickness region of from 0.4 to 2.5 μm. The SOI substrate after formation of the piezoelectric substance film was in a satisfactory state with little bending. The handle layer of the SOI substrate was etched off to form a separate liquid chamber portion and a flow path portion, and to form a piezoelectric substance element corresponding to FIG. 3. The substrate was adhered with another separately prepared substrate, in which a discharge port 11 and a communicating opening 12 connecting the separate liquid chamber and the discharge port are prepared, thereby obtaining a liquid discharge head A corresponding to FIG. 2. The SOI substrate showed little bending and a satisfactory adhesion state, without problems such as film peeling.

The characteristics of this liquid discharge head were evaluated by discharging an ink, containing a dye in an amount of 7.5 wt %. The piezoelectric substance film in the 4-inch substrate showed a film thickness fluctuation of ±5%, but the discharge and the discharge speed showed little fluctuation, and showed satisfactorily little variation in a discharge durability test. Also even when the number of discharge ports was increased, the device showed little fluctuation in the characteristics among the discharge ports.

Example 3

On an Si substrate having laminated layers $YSZ/CeO_2/LaNiO_3/SrRuO_3$, a $(Pb, La)TiO_3$ (PLT) epitaxial film was formed with a thickness of 1.2 μm as a clad layer by MOCVD. Then a core layer of (Pb, La) (Zr, Ti)$O_3$ (PLZT) (La/Zr/Ti composition ratio=8/65/35) was formed thereon with a thickness of 6 μm. In the course of film formation, the oxygen gas pressure and the substrate temperature among the film forming conditions were so changed, from a thickness of 1.3 μm, that the proportion of the tetragonal phase decreased. On the PLZT film, a clad PLT layer was formed in a similar manner as the aforementioned clad layer, and Cu—W was employed as a polarizing electrode to obtain an optical element. According to Raman spectroscopic measurement, the core layer was identified as a film in which the mixing proportion of the crystal phases started to change from a thickness of 1.3 μm. The film showed a higher proportion of tetragonal at the Si substrate side and a lower proportion at the polarizing electrode side, and provided an optical modulation element of satisfactory characteristics, with same variation amounts in TE mode and in TM mode. The crystal phases of the film were a tetragonal phase and a pseudocubic. Within a film thickness range of from 1.0 to 3.5 μm, the composition in the B-site elements was constant with a change or 2.0% or less. The region showing a gradual change in the proportion of crystal phases was from 1.3 to 3.2 μm in the thickness.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-066361, filed Mar. 10, 2006, which is incorporated herein by reference in its entirety.

What is claimed is:

1. A piezoelectric substance element comprising, on a substrate:
    a first electrode;
    a piezoelectric substance film; and
    a second electrode,
    wherein the piezoelectric substance film does not contain a layer-structured boundary plane,
    the crystal phase constituting the piezoelectric substance film comprises at least two of a tetragonal, a rhombohedral, a pseudocubic, an orthorhombic and a monoclinic, and
    the piezoelectric substance film includes, in a portion in which a change in the composition is within a range of ±2%, a portion where a proportion of the different crystal phases changes gradually in a thickness direction of the film.

2. A piezoelectric substance element according to claim 1, wherein the piezoelectric substance film at least includes a tetragonal; and a volume proportion of the tetragonal is relatively lower at a surface side of the piezoelectric substance film in a thickness direction thereof and is relatively higher at the other surface side.

3. A piezoelectric substance element according to claim 1, wherein the piezoelectric substance film has an orientation {100}.

4. A piezoelectric substance element according to claim 1, wherein the piezoelectric substance film comprises at least one of a lead zirconate titanate type material and a relaxor material.

5. A piezoelectric substance element according to claim 1, wherein the piezoelectric substance film has a thickness of from 1.0 to 15 μm.

6. A liquid discharge head including a discharge port for discharging a liquid, a liquid flow path communicating with the discharge port, and a discharge energy generating element for generating energy to be used for liquid discharge from the discharge port, the discharge energy generating element comprising, on a substrate:
- a first electrode;
- a piezoelectric substance film; and
- a second electrode, wherein the piezoelectric substance film does not contain a layer-structured boundary plane, the crystal phase constituting the piezoelectric substance film comprises at least two of a tetragonal, a rhombohedral, a pseudocubic, an orthorhombic and a monoclinic, and the piezoelectric substance film includes, in a portion in which a change in the composition is within a range of ±2%, a portion where a proportion of the different crystal phases changes gradually in a thickness direction of the film.

* * * * *